(12) United States Patent
Takezawa et al.

(10) Patent No.: US 11,814,568 B2
(45) Date of Patent: Nov. 14, 2023

(54) ANISOTROPIC THERMAL CONDUCTIVE RESIN MEMBER AND MANUFACTURING METHOD THEREOF

(71) Applicants: HITACHI CHEMICAL COMPANY, LTD., Tokyo (JP); THE UNIVERSITY OF TOKYO, Tokyo (JP)

(72) Inventors: Yoshitaka Takezawa, Tokyo (JP); Masahiro Nomura, Tokyo (JP)

(73) Assignees: RESONAC CORPORATION, Tokyo (JP); THE UNIVERSITY OF TOKYO, Tokyo (JP)

( * ) Notice: Subject to any disclaimer, the term of this patent is extended or adjusted under 35 U.S.C. 154(b) by 37 days.

(21) Appl. No.: 16/976,762

(22) PCT Filed: Feb. 27, 2019

(86) PCT No.: PCT/JP2019/007586
§ 371 (c)(1),
(2) Date: Aug. 31, 2020

(87) PCT Pub. No.: WO2019/168038
PCT Pub. Date: Sep. 6, 2019

(65) Prior Publication Data
US 2020/0407617 A1    Dec. 31, 2020

(30) Foreign Application Priority Data
Mar. 1, 2018   (JP) .................. 2018-036778

(51) Int. Cl.
*C09K 5/14*      (2006.01)
*D02G 3/36*      (2006.01)

(52) U.S. Cl.
CPC ................. *C09K 5/14* (2013.01); *D02G 3/36* (2013.01)

(58) Field of Classification Search
CPC . C09K 5/00; C09K 5/08; D01D 10/00; D02G 3/36
See application file for complete search history.

(56) References Cited

U.S. PATENT DOCUMENTS

| | | | |
|---|---|---|---|
| 3,091,019 A | 5/1963 | Wetterau | |
| 3,889,038 A | 6/1975 | Wiczer | |
| 4,107,135 A | 8/1978 | Duggins et al. | |
| 4,420,534 A * | 12/1983 | Matsui | D01F 1/09 428/397 |
| 5,542,471 A * | 8/1996 | Dickinson | C04B 35/80 165/185 |
| 2003/0056943 A1 | 3/2003 | Dessiatoun et al. | |
| 2003/0167548 A1 | 9/2003 | LaShoto et al. | |
| 2005/0101719 A1 | 5/2005 | Ishihara | |
| 2008/0311811 A1 | 12/2008 | Douglas | |
| 2010/0009585 A1 | 1/2010 | Jennings et al. | |

(Continued)

FOREIGN PATENT DOCUMENTS

| CN | 103687923 | 3/2014 |
|---|---|---|
| CN | 106498538 A * | 3/2017 |

(Continued)

*Primary Examiner* — Matthew R Diaz
(74) *Attorney, Agent, or Firm* — JCIPRNET

(57) ABSTRACT

An aspect of the present invention is an anisotropic thermal conductive resin member including a plurality of bundled thermoplastic resin stretch fibers.

2 Claims, 2 Drawing Sheets

(56) References Cited

U.S. PATENT DOCUMENTS

| | | | |
|---|---|---|---|
| 2010/0288500 A1* | 11/2010 | Carlson | D04H 1/42 428/394 |
| 2012/0067548 A1 | 3/2012 | Tun | |
| 2014/0210068 A1 | 7/2014 | Bartley et al. | |
| 2014/0367078 A1* | 12/2014 | Burger | C09K 5/14 570/123 |
| 2017/0030012 A1 | 2/2017 | Bathelier et al. | |
| 2018/0044561 A1 | 2/2018 | Goletto | |
| 2019/0110935 A1* | 4/2019 | Rosati | A61F 13/51121 |
| 2020/0407617 A1 | 12/2020 | Takezawa | |

FOREIGN PATENT DOCUMENTS

| | | | | |
|---|---|---|---|---|
| CN | 107000376 | | 8/2017 | |
| JP | H06214067 | | 8/1994 | |
| JP | 2000068429 | | 3/2000 | |
| JP | 2000151164 | | 5/2000 | |
| JP | 2000273196 | | 10/2000 | |
| JP | 2001168248 | | 6/2001 | |
| JP | 2002088171 A | * | 3/2002 | |
| JP | 2002093969 A | * | 3/2002 | |
| JP | 2004225170 | | 8/2004 | |
| JP | 2004285522 | | 10/2004 | |
| JP | 2004285522 A | * | 10/2004 | |
| JP | 2014522109 | | 8/2014 | |
| JP | 2017087446 | | 5/2017 | |
| KR | 2015130598 A | * | 11/2015 | |
| WO | 2011048824 | | 4/2011 | |
| WO | 2011101464 | | 8/2011 | |
| WO | 2015178416 | | 11/2015 | |
| WO | WO-2015178416 A1 | * | 11/2015 | |
| WO | 2015190930 | | 12/2015 | |
| WO | WO-2015190930 A1 | * | 12/2015 | ............... C09K 5/14 |
| WO | 2017078888 | | 5/2017 | |
| WO | 2017141682 | | 8/2017 | |

* cited by examiner

ANISOTROPIC THERMAL CONDUCTIVE RESIN MEMBER AND MANUFACTURING METHOD THEREOF

CROSS-REFERENCE TO RELATED APPLICATION

This application is a 371 application of the international PCT application serial no. PCT/JP2019/007586, filed on Feb. 27, 2019, which claims the priority benefit of Japan application no. 2018-036778, filed on Mar. 1, 2018. The entirety of each of the above-mentioned patent applications is hereby incorporated by reference herein and made a part of this specification.

TECHNICAL FIELD

The present invention relates to an anisotropic thermal conductive resin member and a manufacturing method thereof.

BACKGROUND ART

As electronic components have become highly integrated, smaller, and thinner, in recent years, more heat generated from the electronic components accumulates in electronic devices, and thus reliability problems such as malfunctions of electronic devices and shortening of the lifespan are likely to occur. Therefore, it is important to efficiently dissipate heat generated from the electronic components to the outside via an appropriate path.

In order to address such problems, a resin member having excellent thermal conductivity and electrical insulation is provided between an electronic component and a heatsink. Regarding such a sheet, for example, in Patent Literature 1, a thermal conductive sheet which includes a thermal conductive filler, fibers and a resin and in which the fibers are entangled in a plane shape, the entangled fibers support the thermal conductive filler to form a base sheet, and the resin is filled into the base sheet is disclosed.

CITATION LIST

Patent Literature

Patent Literature 1
Japanese Patent Laid-Open No. 2017-87446

SUMMARY

Technical Problem

However, since heat is isotropically conducted without directivity, when the thermal conductive sheet described in Patent Literature 1 is used, heat is conducted not only in a direction in which heat should be conducted (direction from the electronic component to the heatsink), but also, for example, in a direction of other electronic components in the electronic device. In this case, there is a risk of the reliability of the electronic device being impaired when an electronic component weak with respect to heat is exposed to heat. However, since it is difficult for the resin to have a regular structure such as a crystalline structure, it is difficult to freely impart anisotropy (directivity) for thermal conductivity in the resin member.

Here, an objective of the present invention is to provide a resin member and a manufacturing method thereof through which heat can be anisotropically and efficiently conducted.

Solution to Problem

An aspect of the present invention is an anisotropic thermal conductive resin member including a plurality of bundled thermoplastic resin stretch fibers.

In this resin member, since the stretch fibers are fibers having high orientation, even if they are formed of a thermoplastic resin having low crystallinity, phonons (quasi-particles responsible for heat conduction) are easily confined in stretch fibers. Therefore, in this resin member, heat does not spread uniformly but is conducted with anisotropy (directivity) in the extension direction of the stretch fibers. In addition, in this resin member, since the plurality of stretch fibers are bundled, the cross-sectional area of the heat conduction path (stretch fibers) is larger, and thus heat can be conducted with high efficiency.

Another aspect of the present invention is a method of manufacturing an anisotropic thermal conductive resin member including a step of producing stretch fibers by stretching a thermoplastic resin and a step of bundling the plurality of stretch fibers.

In this manufacturing method, when fibers having high orientation are produced by stretching, even if they are formed of a thermoplastic resin having low crystallinity, stretch fibers that easily confine phonons in fibers are obtained. Therefore, in this manufacturing method, a resin member that can conduct heat with anisotropy (directivity) in the extension direction of the stretch fibers is obtained. In addition, in this manufacturing method, the cross-sectional area of the heat conduction path (stretch fibers) is increased by bundling the plurality of stretch fibers, and thus a resin member capable of conducting heat with high efficiency is obtained.

Advantageous Effects of Invention

According to the present invention, it is possible to provide a resin member and a manufacturing method thereof through which heat can be anisotropically and efficiently conducted.

DESCRIPTION OF EMBODIMENTS

Embodiments of the present invention will be appropriately described below in detail with reference to the drawings.

FIG. 1(*a*) is a perspective view showing a resin member according to one embodiment. As shown in FIG. 1(*a*), a resin member 1 includes a plurality of bundled stretch fibers (also called fiber strands) 2, and is formed into a fiber form.

Figure 1A:
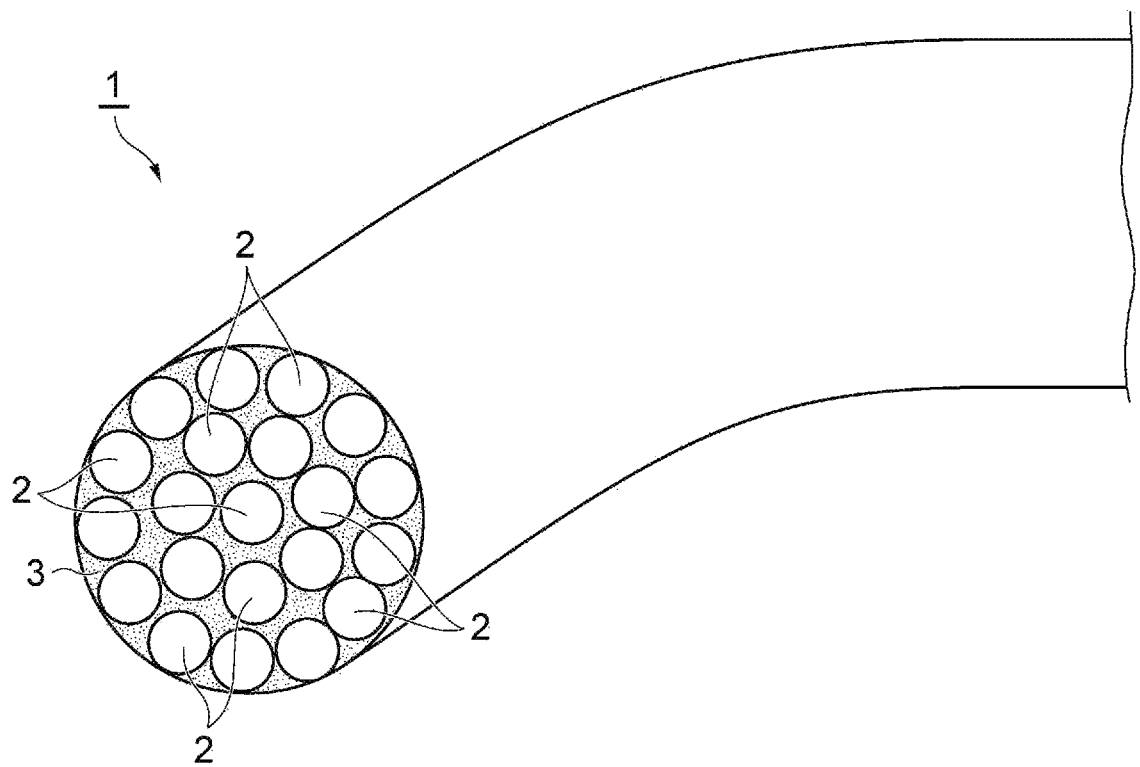
FIG. 1(*a*) is a perspective view showing a resin member according to one embodiment, and FIG. 1(*b*) is a schematic view showing movement of phonons in a stretch fiber.

For example, the plurality of stretch fibers 2 are aggregated (bundled) by a binder 3 that binds the stretch fibers 2 so that they extend in substantially the same direction. When viewed in a cross section, the plurality of stretch fibers 2 may be regularly arranged or irregularly arranged. For example, as shown in FIG. 1(a), the cross-sectional shape of the stretch fibers 2 may be a substantially perfect circle, or may be a regular shape such as an elliptical shape or a polygonal shape, or may be an irregular shape.

The stretch fibers 2 are fibers obtained by stretching a thermoplastic resin. Examples of thermoplastic resins include an acrylic polymer, a methacrylic polymer, polyamide, polyethylene terephthalate, polyarylate, polysulfone, and polyether ether ketone.

In consideration of both ease of phonon confinement and ease of phonon incidence, the diameter (maximum diameter) of the stretch fiber 2 is preferably 0.1 µm or more, more preferably 10 µm or more, and still more preferably 100 µm or more. In consideration of handling properties when bundling, the diameter (maximum diameter) of the stretch fiber 2 is preferably 1,000 µm or less, more preferably 500 µm or less, and still more preferably 200 µm or less.

The binder 3 is not particularly limited, and may be made of, for example, polyurethane, an acrylic polymer, an epoxy resin or the like.

Figure 1B:
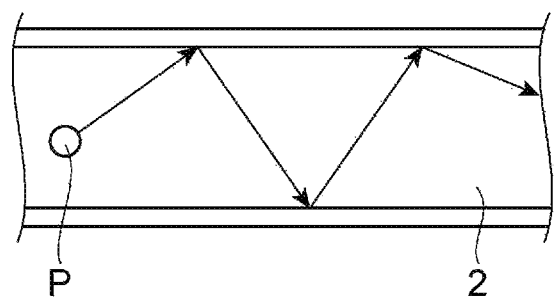

FIG. 1(b) is a schematic view showing movement of phonons in the stretch fibers 2. In the resin member 1, since the stretch fibers 2 are fibers having high orientation, even if they are formed of a thermoplastic resin having low crystallinity, as shown in FIG. 1(b), phonons P are easily confined in the stretch fibers 2. Therefore, heat (phonons) is conducted with anisotropy (directivity) in the extension direction of the stretch fibers 2. That is, the resin member 1 has anisotropic thermal conductivity in which phonons are unlikely to be conducted between the stretch fibers 2 and heat can be anisotropically conducted in one extension direction of the stretch fibers 2. In addition, in the resin member 1, when the plurality of stretch fibers 2 are bundled, the cross-sectional area of the heat conduction path (the stretch fibers 2) is larger, and thus heat can be conducted with high efficiency.

Next, a method of manufacturing the resin member 1 will be described. This manufacturing method includes a step in which a thermoplastic resin is stretched to produce stretch fibers (stretch fiber producing step) and a step in which the plurality of stretch fibers are bundled (bundling step).

Figure 2:
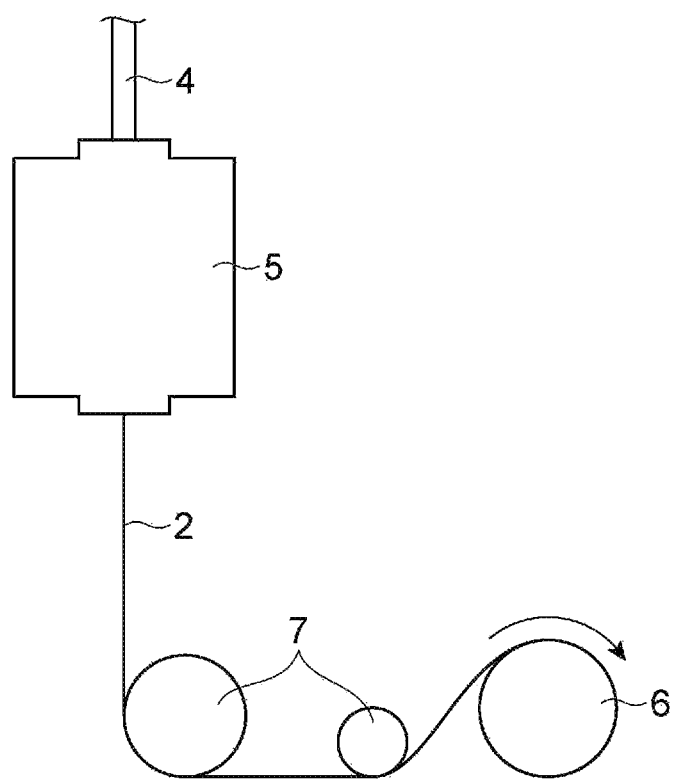
FIG. 2 is a schematic view showing a stretch fiber producing step according to one embodiment.

FIG. 2 is a schematic view illustrating a stretch fiber producing step according to one embodiment. In the stretch fiber producing step, first, as shown in FIG. 2, a thermoplastic resin 4 is heated in a heating furnace 5 and stretched in a winding direction (pulling direction) by being wound (pulled) by a winding part 6. Specifically, first, for example, the thermoplastic resin 4 molded into a rod having a diameter of 5 to 50 mm is put into the heating furnace 5. The thermoplastic resin 4 is heated in the heating furnace 5 and stretched by being wound (pulled) by the winding part 6 installed at the tip of the heating furnace 5.

The temperature of the heating furnace 5 is appropriately set according to the softening temperature of the thermoplastic resin 4, and in order to suitably impart orientation when the thermoplastic resin 4 is stretched, preferably, the temperature is equal to or higher than a thermal distortion temperature of the thermoplastic resin and lower than the melting point. The thermoplastic resin 4 is stretched, for example, under conditions in which the stretch ratio is 10 to 1,000.

The stretch fibers 2 thus ejected from the heating furnace 5 in this manner are formed into a fine wire having a diameter smaller than the diameter of the thermoplastic resin 4 (the diameter of the rod) before they are put into the heating furnace 5. The stretch fibers 2 are wound around the winding part 6 along a roller 7 that is appropriately provided between the heating furnace 5 and the winding part 6.

In the bundling step following the stretch fiber producing step, a plurality of stretch fibers 2 are prepared, and the plurality of stretch fibers 2 are bundled using the binder 3. The bundling method may be a known method. Thereby, the resin member 1 is obtained.

In the method of manufacturing the resin member 1 described above, when the stretch fibers 2 having high orientation are produced by stretching, even if they are formed of a thermoplastic resin having low crystallinity, the stretch fibers 2 that easily confine phonons P in fibers are obtained. Therefore, in this manufacturing method, the resin member 1 that conducts heat with anisotropy (directivity) in the extension direction of the stretch fibers 2 is obtained. In addition, in the method of manufacturing the resin member 1, the cross-sectional area of the heat conduction path (the stretch fibers 2) is increased by bundling the plurality of stretch fibers 2, and thus the resin member 1 capable of conducting heat with high efficiency is obtained.

The invention claimed is:

1. A method of manufacturing an anisotropic thermal conductive resin member, comprising:
   a step of producing stretch fibers by stretching a thermoplastic resin, wherein the thermoplastic resin consists of at least one selected from the group consisting of an acrylic polymer, a methacrylic polymer, polyethylene terephthalate, polyarylate, polysulfone, and polyether ether ketone; and
   a step of bundling the plurality of stretch fibers by at least one binder selected from the group consisting of polyurethane, an acrylic polymer, and an epoxy resin
   wherein the anisotropic thermal conductive resin member consists of the stretch fibers and the at least one binder.

2. The method according to claim 1, wherein a diameter of each of the stretch fibers is 200 µm or less.

* * * * *